(12) United States Patent
Kim et al.

(10) Patent No.: US 7,705,529 B2
(45) Date of Patent: Apr. 27, 2010

(54) FULL COLOR ORGANIC ELECTROLUMINESCENT DEVICE AND METHOD FOR FABRICATING THE SAME

(75) Inventors: Mu-Hyun Kim, Suwon-si (KR); Byung-Doo Chin, Seongnam-si (KR); Min-Chul Suh, Seongnam-si (KR); Nam-Choul Yang, Seoul (KR); Seong-Taek Lee, Suwon-si (KR)

(73) Assignee: Samsung Mobile Display Co., Ltd., Yongin (KR)

( * ) Notice: Subject to any disclaimer, the term of this patent is extended or adjusted under 35 U.S.C. 154(b) by 311 days.

(21) Appl. No.: 10/938,471

(22) Filed: Sep. 9, 2004

(65) Prior Publication Data

US 2005/0057150 A1 Mar. 17, 2005

(30) Foreign Application Priority Data

Sep. 15, 2003 (KR) .................... 10-2003-0063752

(51) Int. Cl.
*H05B 33/00* (2006.01)
(52) U.S. Cl. ...................................... 313/504; 428/690
(58) Field of Classification Search ......... 313/503–512; 428/690, 917
See application file for complete search history.

(56) References Cited

U.S. PATENT DOCUMENTS

| | | | |
|---|---|---|---|
| 5,220,348 A | 6/1993 | D'Aurelio | |
| 5,256,506 A | 10/1993 | Ellis et al. | |
| 5,278,023 A | 1/1994 | Bills et al. | |
| 5,308,737 A | 5/1994 | Bills et al. | |
| 5,909,081 A * | 6/1999 | Eida et al. ............. | 313/504 |
| 5,937,272 A | 8/1999 | Tang | |

(Continued)

FOREIGN PATENT DOCUMENTS

CN 1212114 A 3/1999

(Continued)

OTHER PUBLICATIONS

Korean Patent Abstracts, Publication No. 1020030019897 A, dated Mar. 7, 2003, in the name of Kazuo Genda et al.

(Continued)

*Primary Examiner*—Joseph L Williams
(74) *Attorney, Agent, or Firm*—Christie, Parker & Hale, LLP (57) ABSTRACT

A full color organic electroluminescent device and a method for fabricating the same reduces misalignment errors caused by fine patterning of the emitting layer by reducing the steps of the fine patterning process. In particular, the blue emitting layer functions as a hole inhibition layer which results in superior color purity and improved stability for the color organic electroluminescent device. The use of such a blue emitting layer also reduces the manufacturing steps. The device comprises a substrate; a first electrode pattern formed on the substrate; a red emitting layer formed by patterning a red emitting material on a red pixel region of the first electrode pattern and a green emitting layer formed by patterning a green emitting material on a green pixel region of the first electrode pattern. A blue emitting layer is applied over the entire substrate, over the upper parts of the red and green emitting layers and a second electrode is formed on an upper part of the blue emitting layer.

11 Claims, 5 Drawing Sheets

U.S. PATENT DOCUMENTS

| | | | |
|---|---|---|---|
| 5,998,085 A | 12/1999 | Isberg et al. | |
| 6,013,982 A * | 1/2000 | Thompson et al. | 313/506 |
| 6,097,147 A | 8/2000 | Baldo et al. | |
| 6,252,253 B1 | 6/2001 | Bao et al. | |
| 6,281,634 B1 | 8/2001 | Yokoyama | |
| 6,303,238 B1 | 10/2001 | Thompson et al. | |
| 6,310,360 B1 | 10/2001 | Forrest et al. | |
| 6,384,529 B2 * | 5/2002 | Tang et al. | 313/506 |
| 6,429,585 B1 | 8/2002 | Kitazume et al. | |
| 6,520,819 B1 | 2/2003 | Sakaguchi | |
| 6,541,130 B2 | 4/2003 | Fukuda | |
| 6,614,175 B2 | 9/2003 | Aziz et al. | |
| 6,835,469 B2 | 12/2004 | Kwong et al. | |
| 6,863,961 B2 | 3/2005 | Miyadhita et al. | |
| 6,876,144 B2 * | 4/2005 | Peng | 313/504 |
| 6,891,326 B2 * | 5/2005 | Lu | 313/504 |
| 6,917,159 B2 | 7/2005 | Tyan et al. | |
| 7,034,339 B2 | 4/2006 | Matsuura et al. | |
| 7,067,985 B2 * | 6/2006 | Adachi | 315/169.3 |
| 7,189,466 B2 * | 3/2007 | Moriyama et al. | 428/690 |
| 2002/0050786 A1 | 5/2002 | Yamazaki et al. | |
| 2003/0042848 A1 | 3/2003 | Park et al. | |
| 2004/0169461 A1 | 9/2004 | Moriyama et al. | |
| 2004/0258954 A1 * | 12/2004 | Takasu et al. | 428/690 |
| 2005/0112402 A1 | 5/2005 | Lee | |
| 2005/0112403 A1 * | 5/2005 | Ju et al. | 428/690 |
| 2005/0184653 A1 * | 8/2005 | Suh et al. | 313/504 |
| 2006/0105201 A1 * | 5/2006 | Lee et al. | 428/690 |
| 2006/0177694 A1 | 8/2006 | Kamatani et al. | |

FOREIGN PATENT DOCUMENTS

| | | |
|---|---|---|
| CN | 1242134 A | 1/2000 |
| JP | 9-115669 | 5/1997 |
| JP | 11-204258 | 7/1999 |
| JP | 2001-250694 | 9/2001 |
| JP | 2002-75645 | 3/2002 |
| JP | 2002-184581 | 6/2002 |
| JP | 2002-260858 | 9/2002 |
| JP | 2003-151776 | 5/2003 |
| KR | 2000-0062303 | 10/2000 |
| KR | 2003-0019897 | 3/2003 |
| KR | 2003-0020034 | 3/2003 |
| KR | 10-2003-0084238 | 11/2003 |
| WO | WO 02/44189 A1 | 6/2002 |
| WO | WO 03/017730 A1 | 2/2003 |

OTHER PUBLICATIONS

Korean Office action dated Jan. 26, 2006 for Korean patent application 10-2003-0084749, priority document to U.S. Publication 2005/0112402.
Korean Office Action, dated Sep. 27, 2005.
Patent Abstracts of Japan for Publication No. 2003-151776; Date of publication of application May 23, 2003, in the name of Tetsuya Kato.
Patent Abstracts of Japan, Publication No. 2001-250694, dated Sep. 14, 2001, in the name of Junichi Sano.
Patent Abstracts of Japan, Publication No. 2002-184581, dated Jun. 28, 2002, in the name of Sukeyuki Fujii.
Patent Abstracts of Japan, Publication No. 2002-260858, dated Sep. 13, 2002, in the name of Mikiko Matsuo.
Japan Patent Abstracts, Publication No. 11-204258, dated Jul. 30, 1999, in the name of Yasunori Kijima et al.
Korean Patent Abstracts, Publication No. 1020030020034 A, dated Mar. 8, 2003, in the name of Hui Seok Bang et al.
Ikai, M., et al., *Highly efficient phosphorescence from organic light-emitting devices with an excitation-block layer*, Applied Physics Letters, vol. 79, No. 2, Jul. 9, 2001, pp. 156-158.
English translation of priority KR 10-2003-0084238, listed above, for U.S. Publication 2005/0112403.
Patent Abstracts of Japan, Publication No. 09-115669, dated Feb. 5, 1997, in the name of Yoshinobu Ueha et al.
Patent Abstracts of Japan, Publication No. 2002-075645, dated Mar. 15, 2002, in the name of Takeshi Nishi et al.
U.S. Office action dated Sep. 4, 2008, for related U.S. Appl. No. 10/903,697, indicating relevance of U.S. Patent listed in this IDS.
U.S. Office action dated May 11, 2007, for related U.S. Appl. No. 10/980,090, indicating relevance of U.S. Publications listed in this IDS.
U.S. Office action dated Aug. 14, 2009, for related U.S. Appl. No. 10/903,697, noting listed reference in this IDS.
Chinese Office action for Chinese Patent Application CN2004100786519, dated Oct. 19, 2007, with an English translation.
Chinese Office action for Chinese Patent Application CN2004100850267, dated Aug. 31, 2007, with partial English translation.

* cited by examiner

FULL COLOR ORGANIC ELECTROLUMINESCENT DEVICE AND METHOD FOR FABRICATING THE SAME

CROSS REFERENCE TO RELATED APPLICATIONS

This application claims priority to and the benefit of Korean Patent Application No. 2003-63752, filed on Sep. 15, 2003, the disclosure of which is incorporated herein by reference in its entirety.

BACKGROUND OF THE INVENTION

1. Field of the Invention

The present invention relates to a full color organic electroluminescent device and a method for fabricating the full color organic electroluminescent device, more particularly, to a full color organic electroluminescent device with reduced pixel misalignment.

2. Description of Related Art

Generally, an organic electroluminescent device comprises various layers including an anode and a cathode, a hole injection layer, a hole transport layer, an emitting layer, an electron transport layer and an electron injection layer. Organic electroluminescent devices are classified as polymeric organic EL (electroluminescent) devices and small molecular organic EL (electroluminescent) devices according to the materials used in making them. The respective layers are introduced by vacuum deposition for a small molecular organic EL device while a polymeric organic EL device is typically fabricated by a spin coating process.

The small molecular organic EL device is completed by laying up a multilayer organic film including a hole injection layer, a hole transport layer, an emitting layer, a hole inhibiting layer and an electron injection layer by deposition processes, and by finally depositing the cathode electrode.

A small molecular organic EL device is fabricated by an existing process by depositing the hole injection layer and the hole transport layer as common layers, depositing red, green and blue colors on the hole injection layer and the hole transport layer, patterning the red, green and blue colors on the hole injection layer and the hole transport layer using a shadow mask, sequentially depositing a hole inhibiting layer and an electron injection layer as common layers on the patterned red, green and blue colors, and depositing the cathode on the hole inhibiting layer and the electron injection layer.

Mass production of a small molecular organic EL device is difficult since such a full color device is fabricated by depositing the respective layers using masks. A fluorescent or phosphorescent device is fabricated by introducing the respective layers using vacuum deposition. Patents regarding full color devices include U.S. Pat. Nos. 6,310,360, 6,303,238 and 6,097,147.

A polymeric organic electroluminescent full color device is fabricated by patterning red, green and blue polymers. Such a polymeric organic electroluminescent device tends to have problems in its emission characteristics. In particular, it generally has lower emission efficiency and reduced lifespan when fabricated using ink jet technology or laser induced thermal imaging.

In order to apply a laser induced thermal imaging process to the fabrication of a full color polymeric organic electroluminescent device, at least a light source, a transfer film and a substrate are required. Light from the light source is absorbed by a light absorption layer of the transfer film so that the light absorbed into the light absorption layer of the transfer film is converted into thermal energy. A transfer layer forming material of the transfer film is transferred to the substrate by the thermal energy to form a desired image as disclosed in U.S. Pat. Nos. 5,220,348, 5,256,506, 5,278,023 and 5,308,737.

The laser induced thermal imaging can also be used to form patterns of emitting materials as disclosed in U.S. Pat. No. 5,998,085.

U.S. Pat. No. 5,937,272 relates to a method for forming an advanced patterned organic layer in a full color organic electroluminescent device in which a donor support is coated with a transferable organic electroluminescent material. The donor support is heated so that the organic electroluminescent material is transferred onto an object such as a recessed surface portion of the subpixels of a thin film transistor to form a colorized organic electroluminescent medium.

Therefore, any process for forming an emitting layer is restricted since fine patterning should be performed for each of the red, green and blue colors to fabricate a full color organic electroluminescent device.

Figure 1:
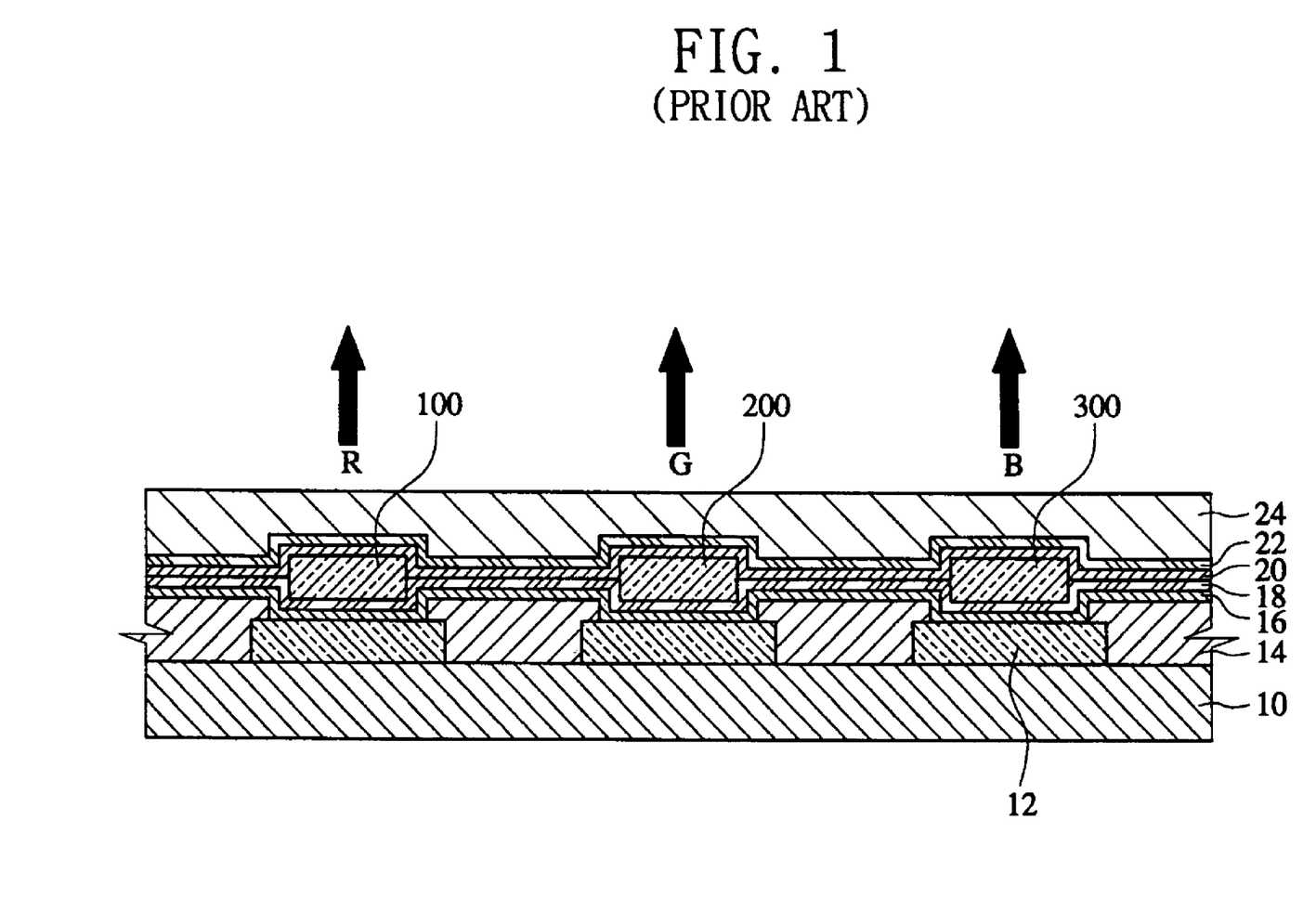
FIG. 1 is a cross sectional view showing the structure of a full color organic electroluminescent device according to the prior art.

FIG. 1 is a cross sectional view illustrating structure of a full color organic electroluminescent device according to prior art.

Referring to FIG. 1, the anode electrode is first patterned by depositing an anode electrode 12 on a substrate 10. An insulation film is applied to the substrate, and together with the anode electrode defines a pixel region. Then, a pixel region is defined by an insulation film 14. A hole injection layer 16 is coated over the red, green and blue pixel regions by such a method as vacuum deposition and a hole transport layer 18 is applied over the hole injection layer. Alternative, the hole injection layer and hole transport layer can be applied as a common layer. Red 100, green 200 and blue 300 are formed on an upper part of the hole transport layer 18 by vacuum deposition, spin coating or laser induced thermal imaging. Red, green and blue are patterned using a shadow mask when using vacuum deposition. However, it is not particularly necessary to use the shadow mask when using a laser induced thermal imaging method which transfers a desired part only.

A hole inhibition layer 20 is coated over the substrate, and an electron transport layer 22 is coated over the hole inhibition layer. Alternatively, the hole inhibition layer and electron transport layer can be coated as a common layer. Finally, a cathode electrode 24 as an upper electrode is laid up on the electron transport layer 22.

Prior art devices often have misalignment problems since the patterning process requires at least three deposition or transfer steps when forming the fine patterns of the red 100, green 200 and blue 300 on the pixel region. Furthermore, the hole inhibition layer is essentially required to be formed on an upper part of the emitting layer to prevent movement of the holes since the movement of holes is faster than the movement of electrons when using a phosphorescence emitting material as the emitting material for forming red, green and blue, that is, when using a host and a phosphorescence material as dopant in the pixel region.

SUMMARY OF THE INVENTION

Therefore, in order to solve the foregoing problems of the prior art, in one embodiment of the present invention, a full color organic electroluminescent device is provided that can be fabricated in fewer steps than are required for existing phosphorescence emitting devices. A method for fabricating the full color organic electroluminescent device is also provided.

In an embodiment of the invention, a full color organic electroluminescent device is provided comprising a substrate; a first electrode formed on the substrate; a red emitting layer formed by patterning red emitting material on a red pixel region and a green emitting layer formed by patterning green emitting material on a green pixel region, each formed of a phosphorescence emitting layer; a blue emitting layer formed over the entire substrate and over the upper parts of both the red emitting layer and the green emitting layer; and a second electrode formed on an upper part of the blue emitting layer.

Furthermore, an embodiment of the present invention provides a method for fabricating a full color organic electroluminescent device comprising the steps of forming a patterned lower electrode on a substrate and forming an insulation film between the pattern of the lower electrode so that pixel regions are defined. The insulation film is superimposed at a part of both ends of the patterned lower electrode, and an emitting region is opened. A hole injection layer and a separate or combined hole transport layer are formed over the entire substrate. Red and green emitting regions are formed in the pixel region using a red phosphorescence emitting material and a green phosphorescence emitting material, respectively. A blue emitting layer is then formed by applying a blue emitting material as a common layer over the entire substrate. Finally, an upper electrode is formed over the entire substrate.

Also, an embodiment of the present invention provides a full color organic electroluminescent device comprising: a substrate; a first electrode pattern formed on the substrate; a red emitting layer formed by patterning red emitting material on a red pixel region and a green emitting layer formed by patterning green emitting material on a green pixel region which are formed on the first electrode; a blue emitting layer formed over the entire substrate including the upper parts of the red emitting layer and the green emitting layer and formed of a blue emitting material having a larger energy band gap than the red emitting material and the green emitting material; and a second electrode formed on an upper part of the blue emitting layer. Preferably, the blue emitting material has an HOMO value of at least |5.5 eV|.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION

The present invention will now be described in detail in connection with various embodiments with reference to the accompanying drawings. For reference, like reference characters designate corresponding parts throughout several views.

Figure 2:
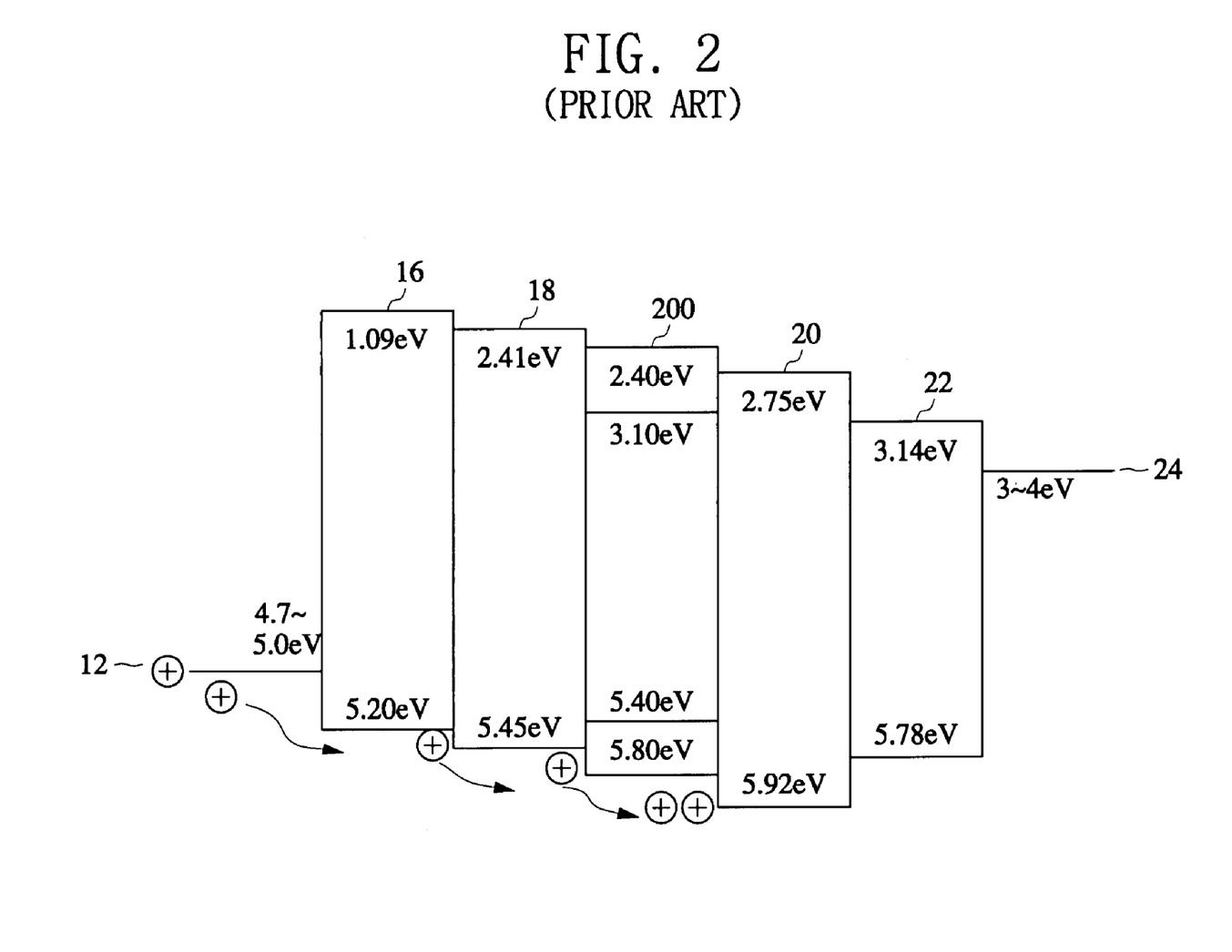
FIG. 2 is an energy band diagram for a conventional green phosphorescence emitting material.
Figure 3:
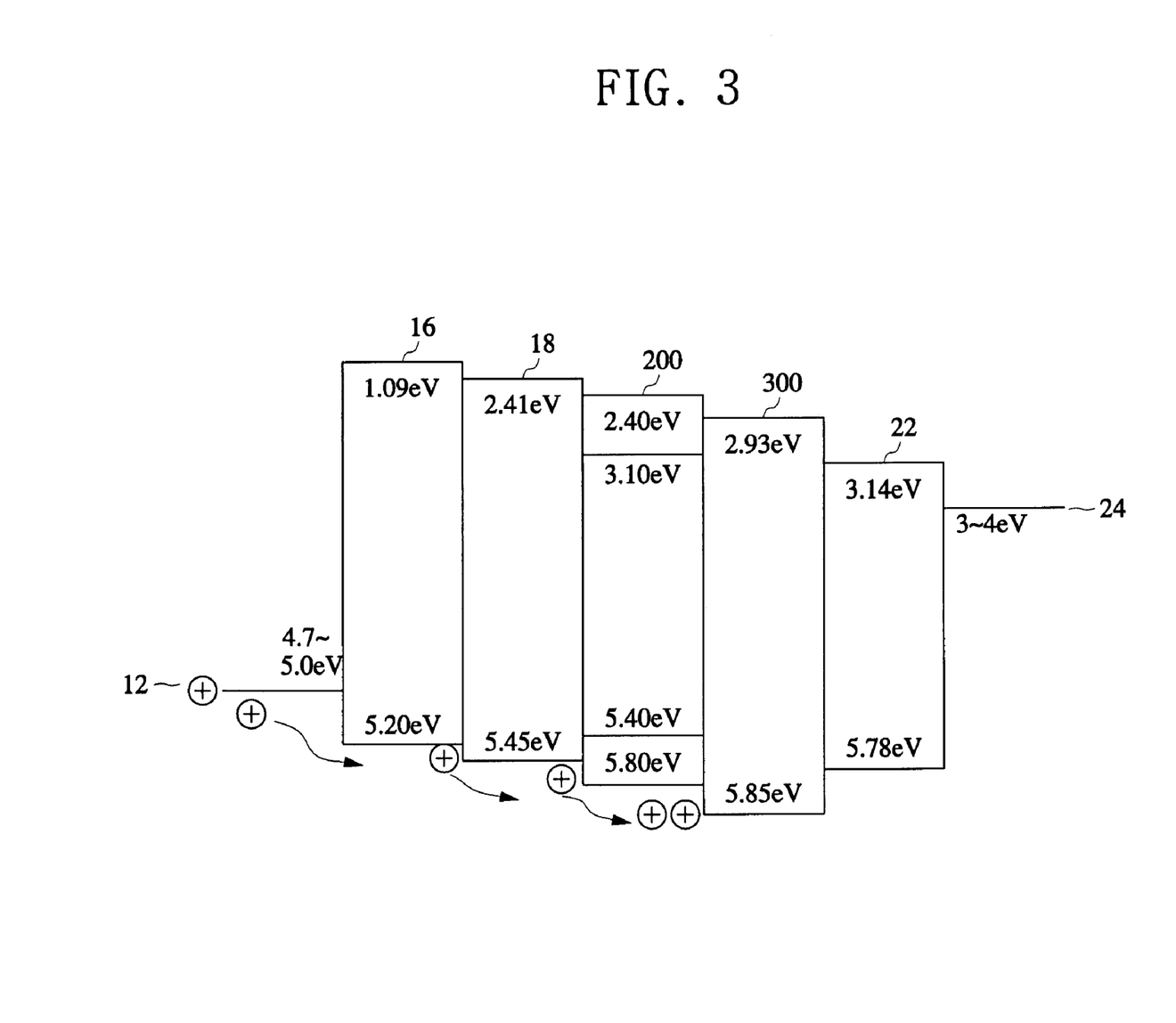
FIG. 3 is an energy band diagram for a green phosphorescence emitting material using a blue emitting material as a common layer according to the present invention.

FIG. 2 is an energy band diagram where only a phosphorescence emitting material is used as the conventional green emitting material, and FIG. 3 is an energy band diagram where a phosphorescence emitting material is used as the green emitting material and a blue emitting material is used as a common layer according to the present invention.

A phosphorescence emitting device in which an existing phosphorescence emitting material is used as an emitting layer comprises a hole injection layer 16 and a hole transport layer 18 formed of a small molecular material in a lower part of the phosphorescence emitting device. The emitting layer is formed with red, green and blue by patterning an emitting layer on the hole injection layer 16 and the hole transport layer 18.

For a green phosphorescence emitting device, color purity deteriorates as the holes are transferred to the electron transport layer 22. The holes are transferred to the electron transport layer where the electrons and holes combine with each other in the emitting layer to produce an exciton since the highest occupied molecular orbital (HOMO) value of the emitting layer 200 is 5.80 eV which is higher than the HOMO value of the electron transport layer 22 which is 5.78 eV.

Therefore, although the electron transport layer 22 can be introduced right after forming an emitting layer for a fluorescence emitting device in which a fluorescence emitting material is used as the emitting layer, a hole inhibition layer having a HOMO value higher than the emitting layer 200 is required for a green phosphorescence emitting device.

In order to inhibit the transferring of the holes to the electron transport layer 22 and increase color purity, a hole inhibition layer 20 is introduced between the emitting layer and the electron transport layer 22. The hole inhibition layer 20 has a HOMO value of 5.92 eV.

Figure 4:
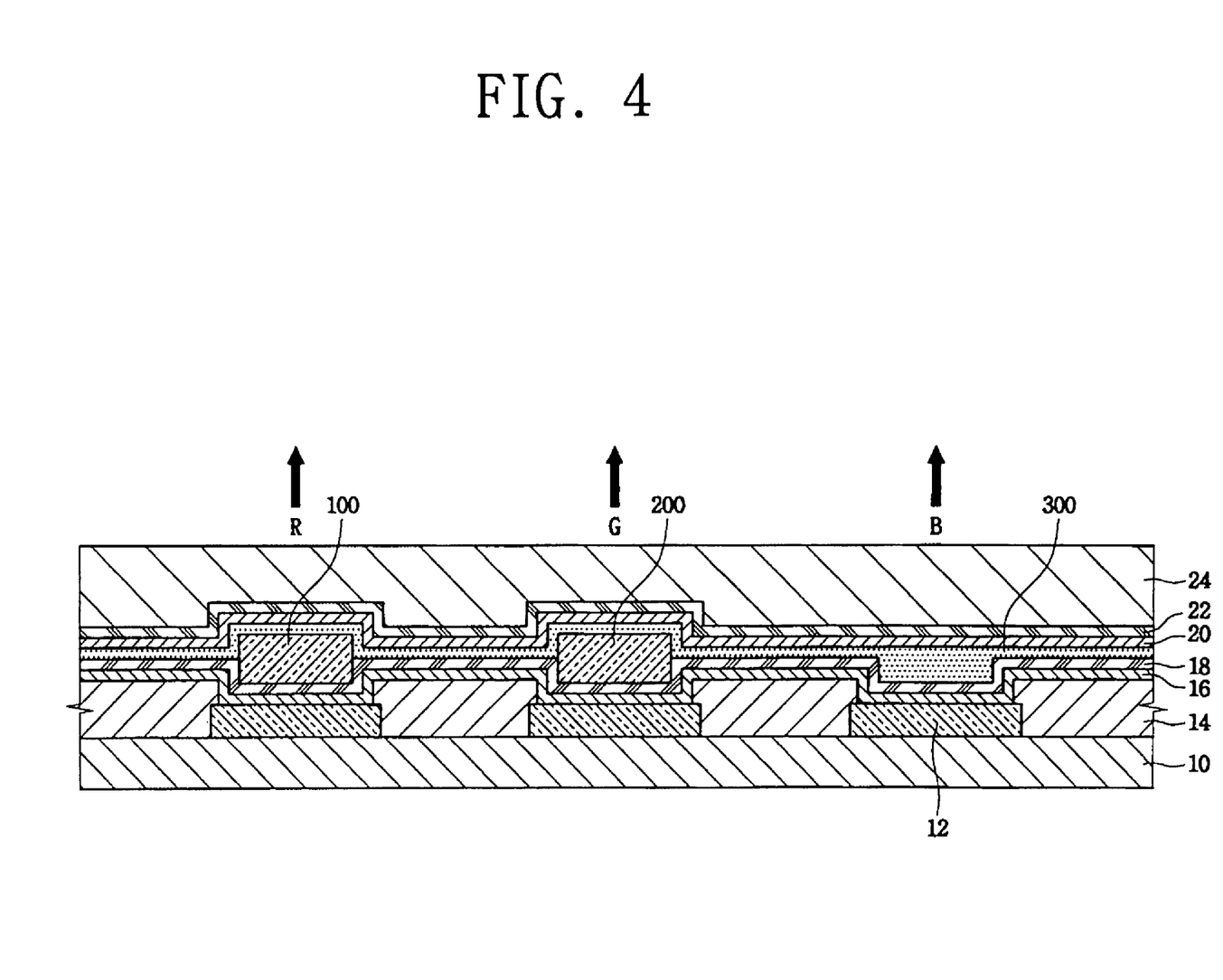
FIG. 4 is a cross sectional view showing the structure of an organic electroluminescent device according to one embodiment of the present invention.

According to an embodiment of the invention as shown in FIG. 4, while a hole injection layer 16 and a hole transport layer 18 are used according to the prior art, a blue emitting layer 300 forms both a fluorescence material and is layered on the upper parts of the red and green phosphorescence emitting layers 100, 200 as a common layer to prevent holes from transferring to the electron transport layer. Therefore, while a separate hole inhibition layer 20 is shown, it is not required.

Referring to FIG. 3, it can be seen that similar results are obtained from the blue emitting layer 300 compared to the hole inhibition layer 20 as illustrated in FIG. 2 since the blue emitting layer 300 introduced between the green emitting layer 200 and electron transport layer 22 as a common layer has a higher HOMO value of 5.85 eV compared to a HOMO value of 5.80 eV for the green emitting layer 200, thereby inhibiting the transfer of holes.

It is preferable that the blue emitting layer is a blue fluorescence emitting layer.

Although the green phosphorescence emitting layer 200 is described above as an example, an explanation of the red phosphorescence emitting layer 100 is omitted since the same effect is obtained for a red phosphorescence emitting layer 100.

Also, although the blue fluorescence emitting material is described in the above example as a blue emitting layer 300, a blue emitting material having a larger energy band gap than the red emitting material and the green emitting material can also be used. It is preferred that the blue emitting material has a HOMO value of at least |5.5 eV|.

Referring again to FIG. 4, an embodiment of the present invention using the principle is illustrated in a cross sectional view showing the structure of a full color organic electroluminescent device according to one embodiment of the present invention. The lower electrode 12 is patterned on the lower substrate 10. A metallic reflective film is used as the lower electrode for a front emission structure while a transparent material such as ITO or IZO is used to form a transparent electrode for a rear emission structure. An insulation film (PDL) 14 for defining the pixel regions is then formed on the lower electrode. After forming the insulation film on the lower electrode, a hole injection layer 16 and/or a hole transport layer 18 using an organic film are formed over the entire substrate.

The organic film is formed of small molecules such as CuPc, TNATA, TCTA and TDAPB and polymers such as PANI and PEDOT are used as an ordinary hole injection layer, and the hole transport layer is formed of small molecules such as NPB, TPD, s-TAD, MTADATA, arylamine, hydrazone, stylbene and star burst based small molecules, and polymers such as PVK, carbazole, arylamine, perylene and pyrrole based polymers.

A pixel region is formed by patterning red phosphorescence emitting material and green phosphorescence emitting material on the red 100 and green 200 regions in the pixel region after forming a hole injection layer 16 and/or a hole transport layer 18.

The red phosphorescence emitting material is a phosphorescence emitting material which is doped with a material capable of emitting phosphorescence in the triplet state. The red emitting material consists of a host that is a material capable of transferring energy to a phosphorescence dopant, wherein the host is selected from the group consisting of carbazole, arylamine, hydrazone, stylbene, star burst based derivatives such as CBP, and combinations thereof, and the dopant is an organic complex of a metal selected from the group consisting of Ir, Pt, Eu and Tb. An example is PtOEP. The green phosphorescence emitting material is a phosphorescence emitting material doped with a material capable of emitting phosphorescence in the triplet state. The green emitting material consists of a host comprising CBP and a dopant that is an organic complex of a metal selected from the group consisting of Ir, Pt, Eu and Tb. An example is IrPPY.

A phosphorescence emitting material in which the host is doped with 7 to 15 wt. % of dopant is used as the red phosphorescence emitting material. A phosphorescence emitting material in which host is doped with 5 to 10 wt. % of dopant is used as the green phosphorescence emitting material.

When using vacuum deposition, the red and green material are finely patterned using shadow masks. When using spin coating or laser induced thermal imaging, it is not necessary to pattern the red and green materials using shadow masks.

The thickness of the red emitting layer 100 is preferably 100 to 1,000 Å. The emission efficiency is lowered due to an insufficient recombination region of the exciton if the thickness of the red emitting layer 100 is too thin while the driving voltage is increased if the thickness of the red emitting layer 100 is too thick. However, for thicker red emitting layers, a material having better charge carrying capability can be used since the increase in driving voltage is not unreasonably high.

The thickness of the green emitting layer 200 is preferably 100 to 1,000 Å. The emission efficiency is lowered due to an insufficient recombination region for the exciton if the thickness of the green emitting layer 100 is too thin while driving voltage is increased if the thickness of the green emitting layer 100 is too thick. However, the invention can also be applied to a currently known emitting layer, and a material having good charge carrying capability can be used even in the higher thickness range since the increase in driving voltage is not unreasonably high.

A blue emitting layer 300 is formed by coating a blue fluorescence emitting material as a common layer over the entire substrate after forming the red and green layers using phosphorescence emitting materials. The patterning process is simplified since the blue fluorescence emitting material is coated on an upper part of the red and green regions so that it is not necessary to finely pattern the blue emitting region. A full color organic electroluminescent device of the present invention has superior stability compared to an existing full color organic electroluminescent device since the emitting material degrades less because the blue emitting material is coated on the front surface of the substrate.

Although the thickness of the blue emitting layer 300 should be optimized according to the color coordinates and emission efficiency of red, green and blue, the thickness of the blue emitting layer 300 is preferably 500 Å or less since the driving voltage of the red and green pixels increases, and the color coordinates of the red and green pixels are changed if the thickness of the blue emitting layer 300 is 500 Å or more.

The blue emitting layer can be formed of blue fluorescence emitting material. Preferably, the blue fluorescence emitting material is a small molecular material selected from the group consisting of DPVBi, spiro-DPVBi, spiro-6P, distylbenzene (DSP) and distyrylarylene (DSA), and small molecular materials formed of two or more host/dopant materials selected from the group consisting of DPVBi, spiro-DPVBi, spiro-6P, distylbenzene (DSP) and distyrylarylene (DSA), or a polymeric material selected from PFO based polymer and PPV based polymer.

Meanwhile, a blue emitting material having a larger energy band gap than the red emitting material and the green emitting material can also be used as the blue emitting material. Preferably, the blue emitting material has a HOMO value of at least |5.5 eV|.

While according to the present invention, there is a possibility of color mixing as the blue emitting material is coated on an upper part of the red and green regions, color purity is not deteriorated by the color mixing in a full color organic electroluminescent device of the present invention since the emitting wavelength is maintained in the preferable wavelength range by limiting the emitting range of the red and green to the emitting layer of red and green only so that the blue emitting layer does not contribute to emission in the red and green regions.

A full color organic electroluminescent device is completed by forming an electron transport layer 22 in an ordinary manner, and optionally, an electron injection layer which is not shown in the figure can be further introduced on the electron transport layer 22, coating an upper electrode 24 on an upper part of the electron transport layer and/or an electron injection layer over the entire substrate and sealing the upper electrode coated on the electron transport layer and/or the electron injection layer.

Examples of the present invention are suggested as follows. However, the following test examples are provided only to help understand the present invention well, and the present invention is not limited to the following test examples.

EXAMPLE 1

A hole injection layer having thickness of 30 nm formed of 4,4',4"-tris(N-3-methylphenyl)-N-phenylamino)triphenylamine (MTDATA, Sensient Imaging Technologies GmbH) and a hole transport layer having thickness of 30 nm or less formed of N,N'-di(naphthalen-1-yl)-N,N'-diphenyl-benzidine (NPB) were formed on a patterned test cell. A red phosphorescence emitting layer was patterned and formed to a thickness of 35 nm from a host of CBP manufactured by UDC Corporation, doped with a dopant of R7 manufactured by UDC Corporation to a concentration of about 10%. A blue fluorescence emitting layer 10 nm thick was formed by doping a blue fluorescence emitting material of IDE 120 (manufactured by Idemitsu Corporation), with a DPVBi type dopant (Idemitsu Kosan) and applying the material to an upper part of the patterned red phosphorescence emitting layer and over the entire test cell. The red phosphorescence emitting layer was formed and patterned by laser induced thermal imaging. The test cell was completed by laying up Alq3 manufactured by New Japanese Iron Chemical Corporation as an electron transport layer to a thickness of 20 nm on the patterned red phosphorescence emitting layer, depositing the cathode on the electron transport layer and sealing the cathode deposited test cell using glass. The color coordinates of the completed test cell were measured.

EXAMPLE 2

A hole injection layer having a thickness of 30 nm formed of (4,4',4"-tris(N-3-methylphenyl)-N-phenylamino)triphenylamine (MTDATA, Sensient Imaging Technologies GmbH) and a hole transport layer having a thickness of 30 nm or less formed of N,N'-di(naphthalen-1-yl)-N,N'-diphenyl-benzidine (NPB) were formed on a patterned test cell. A green phosphorescence emitting layer was patterned and formed with a thickness of 20 nm from a host of CBP manufactured by UDC Corporation, doped with a dopant of IrPPy manufactured by UDC Corporation to a concentration of about 5%. A blue fluorescence emitting layer 10 nm thick was formed by doping a blue fluorescence emitting material, IDE 120 (manufactured by Idemitsu Corporation), with DPVBi type dopant (Idemitsu Kosan) and applying the material to an upper part of the patterned green phosphorescence emitting layer and over the entire test cell. The green phosphorescence emitting layer was formed and patterned by laser induced thermal imaging. The test cell was completed by laying up Alq3 manufactured by New Japanese Iron Chemical Corporation as an electron transport layer to a thickness of 20 nm on the patterned green phosphorescence emitting layer, depositing the cathode on the electron transport layer and sealing the cathode deposited test cell using glass. The color coordinates of the completed test cell were measured.

Comparative Example 1

A hole injection layer having thickness of 30 nm formed of (4,4',4"-tris(N-3-methylphenyl)-N-phenylamino)triphenylamine (MTDATA, Sensient Imaging Technologies GmbH) and a hole transport layer having a thickness of 30 nm or less formed of N,N'-di(naphthalen-1-yl)-N,N'-diphenyl-benzidine (NPB) were formed on a patterned test cell. A red phosphorescence emitting layer was patterned and formed with a thickness of 35 nm from a host of CBP manufactured by UDC Corporation doped with a dopant of R7 manufactured by UDC Corporation to a concentration of about 10%. The red phosphorescence emitting layer was formed and patterned by laser induced thermal imaging. The test cell was completed by forming a hole inhibition layer of BAlq manufactured by UDC Corporation as a common layer to thickness of 5 nm over the entire substrate, forming Alq3 manufactured by New Japanese Iron Chemical Corporation as an electron transport layer to a thickness of 20 nm on the hole inhibition layer, depositing the cathode on the electron transport layer and sealing the cathode deposited test cell using glass. The color coordinates of the completed test cell were measured.

Comparative Example 2

A hole injection layer having a thickness of 30 nm formed of (4,4',4"-tris(N-3-methylphenyl)-N-phenylamino)triphenylamine (MTDATA, Sensient Imaging Technologies GmbH) and a hole transport layer having a thickness of 30 nm or less formed of N,N'-di(naphthalen-1-yl)-N,N'-diphenyl-benzidine (NPB) were formed on a patterned test cell. A green phosphorescence emitting layer was patterned and formed with a thickness of 20 nm from a host of CBP manufactured by UDC Corporation doped with a dopant of IrPPy manufactured by UDC Corporation to a concentration of about 5%. The green phosphorescence emitting layer was formed and patterned by laser induced thermal imaging. The test cell was completed by forming a hole inhibition layer of BAlq manufactured by UDC Corporation as a common layer to a thickness of 5 nm over the entire substrate, laying up Alq3 manufactured by New Japanese Iron Chemical Corporation as an electron transport layer to a thickness of 20 nm on the hole inhibition layer, depositing the cathode on the electron transport layer and sealing the cathode deposited test cell using glass. The color coordinates of the completed test cell were measured.

The test results of the color coordinates of test examples 1 and 2 and comparative examples 1 and 2 are represented as in the following table 1.

TABLE 1

|  | CIE x | CIE y |
| --- | --- | --- |
| Test example 1 | 0.63 | 0.34 |
| Test example 2 | 0.33 | 0.61 |
| Comparative example 1 | 0.64 | 0.33 |
| Comparative example 2 | 0.33 | 0.61 |

As seen in the table 1, there is hardly any red emission color purity difference between the test Example 1 according to the present invention and Comparative Example 1 which used a red phosphorescence emitting material and a hole inhibition layer. Furthermore, it can be seen that there is hardly any green emission color purity difference between the test Example 2 according to the present invention and Comparative Example 2 which used a green phosphorescence emitting material and a hole inhibition layer.

Figure 5:
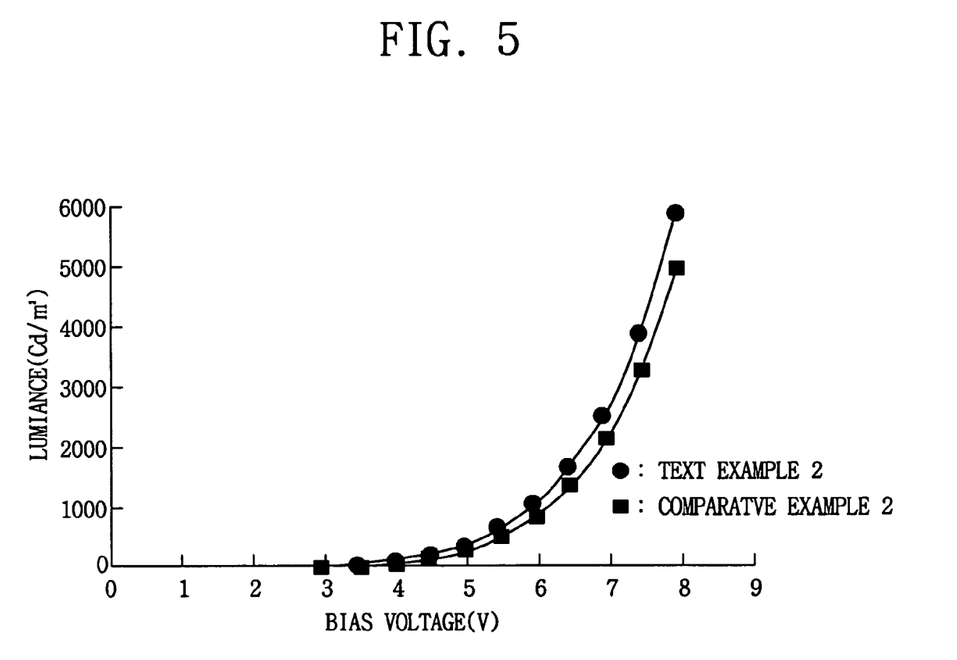
FIG. 5 is a graph showing the relationship between bias voltage and luminance applied for test cells fabricated according to test example 2 and comparative example 2.
Figure 6:
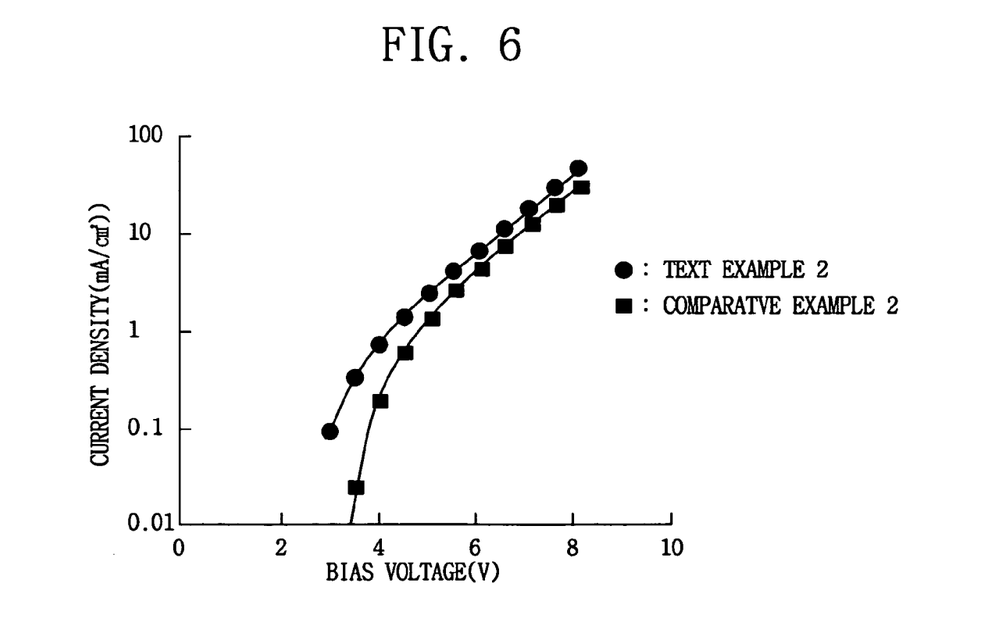
FIG. 6 is a graph for showing the relationship between bias voltage and current density applied for test cells fabricated according to test example 2 and comparative example 2.

FIG. 5 is a graph showing the relationship between bias voltage and luminance applied for test cells fabricated according to test Example 2 and Comparative Example 2, and FIG. 6 is a graph showing the relationship between bias voltage and current density applied to test cells fabricated according to test Example 2 and Comparative Example 2.

Referring to FIGS. 5 and 6, it can be seen that the test cell according to the embodiment of the present invention as shown in Example 2 has a lower bias voltage compared to the test cell of Comparative Example 2 for a given luminance and a given current density.

As described above, a full color organic electroluminescent device of the present invention simplifies the deposition process since it is not necessary to form a hole inhibition layer that would otherwise be required to prevent holes from diffusing from the phosphorescence emitting device to the electron transport layer as the blue fluorescence emitting layer is applied as a common layer on an upper part of the red and green phosphorescence emitting layers. The device of the invention also reduces the number of steps required in manufacture since the emitting layer requires only two patterning steps to produce a full color organic electroluminescent device of the present invention while the emitting layer of an existing organic electroluminescent device requires three patterning steps.

While the invention has been particularly shown and described with reference to preferred embodiments thereof, it will be understood by those skilled in the art that changes in form and detail may be made therein without departing from the spirit and scope of the invention.

What is claimed is:

1. A full color organic electroluminescent device comprising:
   a substrate;
   a first electrode pattern on the substrate and defining red, green and blue pixel regions;
   a red emitting layer comprising red emitting phosphorescent material patterned on the red pixel region;
   a green emitting layer comprising green emitting phosphorescent material patterned on the green pixel region;
   a blue emitting layer comprising a blue fluorescence emitting material, wherein the blue emitting layer includes top and bottom surfaces, the bottom surface extending over the blue pixel region and over the red and green emitting layers; and
   a second electrode over the blue emitting layer.

2. A full color organic electroluminescent device comprising:
   a substrate;
   a first electrode pattern on the substrate and defining red, green and blue pixel regions;
   a red emitting layer comprising red phosphorescence emitting material doped with a material capable of emitting phosphorescence in the triplet state, wherein the red phosphorescence emitting material consists of a host that is a material capable of transferring energy to a phosphorescence dopant, wherein the host is selected from the group consisting of carbazole, arylamine, hydrazone, stylbene, star burst based derivatives and mixtures thereof, and the dopant is an organic complex of a metal selected from the group consisting of Ir, Pt, Eu and Tb;
   a green emitting layer comprising a green phosphorescence emitting material doped with a material capable of emitting phosphorescence in the triplet state, wherein the green phosphorescence emitting material consists of a host that is CBP and a dopant that is an organic complex of a metal selected from the group consisting of Ir, Pt, Eu and Tb;
   a blue emitting layer having top and bottom surfaces, the bottom surface extending over the blue pixel region and over the red and green emitting layers; and
   a second electrode over the blue emitting layer.

3. The full color organic electroluminescent device according to claim 2, wherein the concentration of the dopant for the red phosphorescence emitting material is from 7 to 15%, and the concentration of the dopant for the green phosphorescence emitting material is from 5 to 10%.

4. The full color organic electroluminescent device according to claim 1, wherein the blue fluorescence emitting material is a material selected from the group consisting of:
   a small molecular material selected from the group consisting of DPVBi, spiro-DPVBi, spiro-6P, distylbenzene (DSP) and distyrylarylene (DSA),
   a small molecular material formed of two or more materials of host/dopant selected from the group consisting of DPVBi, spiro-DPVBi, spiro-6P, distylbenzene (DSP) and distyrylarylene (DSA), and
   a polymeric material selected from PFO based polymer and PPV based polymer.

5. The full color organic electroluminescent device according to claim 1, wherein thickness of the red and green phosphorescence emitting layers is from 100 to 1,000 Å.

6. The full color organic electroluminescent device according to claim 1, wherein thickness of the blue emitting layer is 500 Å or less.

7. The full color organic electroluminescent device according to claim 1, wherein the red and green phosphorescence emitting materials are formed by a method selected from the group consisting of vacuum deposition, wet type coating, ink jet printing and laser induced thermal imaging.

8. The full color organic electroluminescent device according to claim 1, wherein the blue emitting material is formed by wet type coating or vacuum deposition.

9. A full color organic electroluminescent device comprising:
   a substrate;
   a first electrode pattern formed on the substrate, the electrode pattern defining red, green and blue pixel regions;
   a red emitting layer comprising red phosphorescence emitting material patterned on the red pixel region
   a green emitting layer comprising green phosphorescence emitting material patterned on the green pixel region;
   a blue emitting layer formed over the blue pixel region and over the red and green phosphorescence emitting layers and comprising a blue fluorescence emitting material having a larger energy band gap than the red emitting material and the green emitting material; and
   a second electrode formed over the blue emitting layer.

10. The full color organic electroluminescent device according to claim 9, wherein the blue emitting material has a HOMO value of at least |5.5 eV |.

11. The full color organic electroluminescent device according to claim 9, wherein the blue emitting material is a material selected from the group consisting of:
   a small molecular fluorescence material selected from the group consisting of DPVBi, spiro-DPVBi, spiro-6P, distylbenzene (DSP) and distyrylarylene (DSA),
   a small molecular material formed of two or more materials of host/dopant selected from the group consisting of DPVBi, spiro-DPVBi, spiro-6P, distylbenzene (DSP) and distyrylarylene (DSA), and
   a polymeric fluorescence material selected from PFO based polymer and PPV based polymer.

* * * * *